United States Patent [19]
Mistry

[11] Patent Number: 5,525,829
[45] Date of Patent: Jun. 11, 1996

[54] FIELD EFFECT TRANSISTOR WITH INTEGRATED SCHOTTKY DIODE CLAMP

[75] Inventor: Kaizad R. Mistry, Brighton, Mass.

[73] Assignee: Digital Equipment Corporation, Maynard, Mass.

[21] Appl. No.: 203,720

[22] Filed: Feb. 28, 1994

Related U.S. Application Data

[63] Continuation of Ser. No. 988,187, Dec. 9, 1992, abandoned.

[51] Int. Cl.$^6$ .......................... H01L 29/80; H01L 27/095; H01L 29/47
[52] U.S. Cl. .......................... 257/473; 257/280; 257/281; 257/486
[58] Field of Search .................................. 257/280, 281, 257/473, 486

[56] References Cited

U.S. PATENT DOCUMENTS

| | | | |
|---|---|---|---|
| 3,617,824 | 11/1971 | Shinoda et al. | 257/382 |
| 4,288,371 | 10/1980 | Mazgy | 307/317 |
| 4,365,171 | 12/1982 | Archer | 307/253 |
| 4,492,974 | 1/1985 | Yoshida et al. | 357/23 |
| 4,513,309 | 4/1985 | Cricchi | 357/42 |
| 4,709,251 | 11/1987 | Suzuki | 357/22 |
| 4,801,983 | 1/1989 | Ueno et al. | 357/15 |
| 4,835,580 | 5/1989 | Havemann et al. | 357/15 |
| 4,963,970 | 10/1990 | Throngunumchai | 357/23.4 |
| 4,982,244 | 1/1991 | Kapoor | 357/15 |
| 5,177,568 | 1/1993 | Honma et al. | 257/473 |

OTHER PUBLICATIONS

J. Sanchez et al., "Drain–Engineered Hot–Electron–Resistant Device Structures: A Review", IEEE Trans. on Elect. Dev., vol. 36, No. 6, pp. 1125–1132, Jun. 1989, place of publication unknown.

C. Hu et al., "Hot–Electron–Induced MOSFET Degradation—Model, Monitor, and Improvement," IEEE Journal of Solid–State Circuits, vol. SC–20, No. 1, Feb. 1985, pp. 295–305, place of publication unknown.

"Prevention of CMOS Circuit Latch–Up", IBM Technical Disclosure Bulletin, vol. 29, No. 5, Oct., 1986, New York, US p. 1967

Patent Abstracts of Japan vol. 8, No. 21 (E–224) 28 Jan. 1984 & JP–A–58 182 871 (Tokyo Shibaura Denki) 25 Oct. 1983.

Yang et al. "Silicide Doping Technology in Formation of TiSi2/N+P Shallow Junction by Salicide Process" Journal of Applied Physics vol. 65, No. 3, 1 Feb. 1989, New York US, pp. 1039–1043.

"Lightly Doped Drain Structure with Reduced Series Resistance to Device Channel" IBM Technical Disclosure Bulletin vol. 32, No. 3A, Aug. 1989, New York, US pp. 485–486.

*Primary Examiner*—Sara W. Crane
*Assistant Examiner*—Valencia Martin Wallace
*Attorney, Agent, or Firm*—Mark J. Casey; Denis G. Maloney; Arthur W. Fisher

[57] ABSTRACT

A MOSFET device is constructed with an integrated Schottky diode clamp connected between the source or drain terminal and the bulk terminal. In an illustrative implementation, one or more MOSFETs are formed in an n-well located in a p-type silicon substrate. Each drain is formed by a p+ region underlying a portion of a metal-silicide layer. In one embodiment, the p+ region underlies an edge of the metal-silicide; in another embodiment, the p+ region underlies opposing edges of the metal-silicide, such that a portion of the metal-silicide contacts the n-well. Each source is formed by a p+ region underlying a layer of metal-silicide. Each gate includes a layer of p+ or n+ polycrystalline silicon clad with a layer of metal-silicide, the gates being separated from the n-well by a layer of oxide. In comparison to p-n junction diodes, the integrated Schottky diodes more effectively limit excess voltages applied to MOSFETs. The clamping performed by the invention reduces wearout and other deleterious effects of excess voltage.

28 Claims, 8 Drawing Sheets

FIELD EFFECT TRANSISTOR WITH INTEGRATED SCHOTTKY DIODE CLAMP

This application is a continuation of application Ser. No. 988,187, filed Dec. 9, 1992, now abandoned.

BACKGROUND OF INVENTION

1. Field of Invention

The present invention relates to field-effect transistors (FETs), and more especially to MOSFETs (metal oxide semiconductor field effect transistors). More particularly, the invention involves an FET device having an integrated Schottky diode connected between its bulk terminal and its drain or source terminal.

2. Description of Related Art

One important problem with MOSFETs is that, under some operating conditions, a variety of reasons may cause one or more terminals of a MOSFET to experience excessive voltage. One of these reasons, for example, is capacitive coupling. To illustrate how a typical MOSFET may experience excessive voltage due to capacitive coupling, cross-sections of a p-channel MOSFET 100 and an n-channel MOSFET 125 are shown in FIG. 1.

The p-channel MOSFET 100 is formed in an n-well 101 located in a p-type silicon substrate 102; the substrate 102 may also be referred to as a "wafer." The n-channel MOSFET 125 is formed in the p-type silicon substrate 102. The term "bulk terminal" will be used herein to refer to the silicon structure upon which a MOSFET is formed, that is, an n-well or an n-type substrate in the case of a p-channel MOSFET, or a p-well or a p-type substrate in the case of an n-channel MOSFET. Thus, the bulk terminal of the MOSFET 100 is the n-well 101, and the bulk terminal of the MOSFET 125 is the p-type silicon substrate 102.

The MOSFET 100 has a source 103, a gate 104, and a drain 105. The source 103 is formed by a p+ region 106 located beneath a layer of metal-silicide 108 made from silicon combined with a refractory metal such as titanium, platinum, cobalt, or the like. The drain 105 is also formed by a p+ region 110 located beneath a layer of metal-silicide 112. The gate 104 includes a layer of p+ or n+ doped polycrystalline silicon 114 clad with a layer of metal-silicide 116. The MOSFET 100 also includes a biasing region 120, which is used in supplying a bias voltage to the n-well 101. The biasing region 120 includes an n+ region 122 underlying a layer of metal-silicide 124.

As mentioned above, the n-channel MOSFET 125 is formed in the p-type silicon substrate 102. The MOSFET 125 has a source 126, a gate 128, and a drain 130. The source 126 is formed by an n+ region 132 located beneath a layer of metal-silicide 134. Similarly, the drain 130 is formed by an n+ region 136 located beneath a layer of metal-silicide 138. The gate 128 includes a layer of p+ or n+ doped polycrystalline silicon 140 clad with a layer of metal-silicide 142. The oxide layer 118 separates the gate 128 from the p-type substrate 102.

A layer of oxide 118 separates the gates 104 and 128 from the n-well 101 and the p-type substrate 102, respectively. The oxide layer 118 includes thickened field isolation regions 118a and thin regions 118b. The field isolation regions 118a insulate the MOSFET 100, the MOSFET 125, and the biasing region 120 from each other, as well as from other MOSFETs (not shown) located on the p-type substrate 102.

The structure of the MOSFET 100 is more easily understood by considering the schematic representation of FIG. 2A. The MOSFET 100 includes a diode 220 to represent the p-n junction diode formed by the p+ region 110 and the n-well 101. If the voltage at the drain 105 rises to a certain level, the diode 220 turns on, and current flows from the p+ region 110 to the n-well 101. In the schematic representation of FIG. 2A, current flows from the drain 105 through the diode 220. The turn-on voltage of the diode 220 is assumed to be 0.7 V, which is the typical turn-on voltage of most silicon p-n junction diodes. The maximum voltage at the drain 105 is therefore $V_{dd}$ plus 0.7 V. When the source 103 and the n-well 101 are both connected to $V_{dd}$, the diode 220 will effectively limit $V_{ds}$ to 0.7 V above $V_{dd}$.

Operation of the MOSFETs 100, 125 is further explained by considering the operation of an inverter constructed with the MOSFETs 100, 125. An inverter provides an illustrative example because it is a common application of MOSFETs such as the MOSFETs 100, 125. Referring to FIG. 2, the inverter is schematically represented by an inverter-model 200 that includes the MOSFETs 100, 125, along with various circuit components 220, 221, 222, and 224 to simulate various electrical characteristics of the MOSFETs 100, 125.

The inverter-model 200 is constructed by electrically connecting the drain 130 to the drain 105. The source 103 is electrically connected to $V_{dd}$, which provides a power supply voltage such as 3.3 V to the circuit. The n-well 101 is also connected to $V_{dd}$ (connection not shown). The source 126 is electrically connected to $V_{ss}$, which is grounded; the substrate 102 is also connected to $V_{ss}$ (connection not shown). The input to the inverter-model 200 is electrically connected to the gates 104, 128, and the output of the inverter-model 200 appears on a node 218.

The inverter-model 200 includes the diode 220, which represents the p-n junction diode formed by the p+ region 110 and the n-well 101, as explained above. If the voltage at the drain 130 rises to 0.7 V, the diode 220 turns on, and current flows from the node 218 through the diode 220. The maximum voltage at the node 218 is therefore $V_{dd}$ plus 0.7 V.

The inverter-model 200 also includes a diode 221 to represent the p-n junction diode formed by the p-type substrate 102 and the n+ region 136. If the voltage at the node 218 falls to a certain level, the diode 221 turns on, and current flows from the p-type substrate 102 to the n+ region 136. In the schematic representation of FIG. 2, current flows from $V_{ss}$ through the diode 221, thereby limiting the voltage drop at the node 218. The voltage of the node 218 is limited to 0.7 V below $V_{ss}$, assuming that the turn-on voltage of the diode 221 is 0.7 V.

As explained above, the p-n junction diodes 220, 221 of the inverter-model 200 are actually part of the drains 105, 130. The sources 103, 126 additionally include p-n junction diodes (not shown), wherein one diode is formed between the p+ region 106 and the n-well 101, and the other diode is formed between the n+ region 132 and the p-type substrate 102. These additional diodes are not discussed herein, however, since they are inoperative when the MOSFETs 100, 125 are configured like the inverter of FIG. 2. They are inoperative because both diodes are effectively shorted out. For example, the p-n junction diode associated with the source 103 is inoperative since both the n-well 101 and the source 103 are connected to $V_{dd}$.

The inverter-model 200 also includes a load capacitor 222, which simulates the capacitance of a load connected to the MOSFETs 100, 125; the capacitor 222 also simulates the self-loading of the MOSFETs 100, 125. Also included is a coupling capacitor 224, to represent the coupling capacitance between the node 218 and an adjacent node 226 on the p-type substrate 102. The adjacent node 226 is provided to simulate the signal produced by another electrical component contained on the p-type substrate 102, such as a nearby current-carrying wire. One of the main reasons to include the node 226 and capacitor 224 is to study the reaction of the inverter-model 200 when the node 226 experiences a transition from a low voltage to a high voltage.

If the node 226 undergoes a low-to-high transition while the node 218 is charged to $V_{dd}$, the capacitor 224 transfers charge to the node 218, due to "capacitive coupling." The voltage increase at the node 218 depends upon the amount of the voltage increase at the node 226, as well as the ratio of the capacitor 224 to the total capacitance of the capacitors 222, 224. For example, if the ratio between the capacitor 224 and the total capacitance of the capacitors 222, 224 is 0.2, and the voltage at the node 226 increases from 0 to $V_{dd}$, then the voltage at the node 218 will exceed $V_{dd}$ by 0.2($V_{dd}$), i.e. node 218 will experience 1.2($V_{dd}$).

To illustrate this further, an example will be given. Many CMOS (complimentary metal oxide semiconductor) circuits such as microprocessor and memory circuits utilize a $V_{dd}$ of 3.3 V. If this voltage is supplied within a tolerance of ±10%, then it is possible that $V_{dd}$ may be as high as 3.6 V. If $V_{dd}$ is 3.6 V, and the ratio of the capacitor 224 to the total capacitance 222, 224 is 0.2, then the voltage at the node 104 will increase to 1.2(3.6)=4.32 V, which exceeds $V_{dd}$ by 0.72 V. This excess voltage cannot go above 0.7 V, however, due to the clamping action of the diode 220. Specifically, if the voltage at the node 218 exceeds $V_{dd}$ by 0.7 V, then the diode 220 lowers the voltage at the node 218 by turning on and conducting current from the node 218 to $V_{dd}$. Since the source 103 is also electrically connected to $V_{dd}$, the drain-source voltage ($V_{ds}$) of the MOSFET 100 is therefore effectively clamped to 0.7 V.

Excess voltage in MOS circuits can lead to a variety of deleterious effects, such as increased off current, "punch-through", and "snapback". Moreover, excess voltage may increase the circuit's susceptibility to wearout, due to phenomena such as "time dependent dielectric breakdown" or "hot carrier degradation". For ease of explanation, increased susceptibility to wearout due to hot carrier degradation will be discussed herein as a representative example of the deleterious effects of excess voltage; it is understood that other phenomena are similarly affected by excess voltage. Hot carrier wearout is discussed in C. Hu et al, "Hot-Electron-Induced MOSFET Degradation—Model, Monitor, Improvement," IEEE Journal of Solid-State Circuits, Vol SC-20, No. 1, February 1986, pp. 295–305.

The hot carrier wearout problem is graphically depicted in FIG. 3, wherein the vertical axis represents "useful lifetime" of a MOSFET in years and the horizontal axis shows the inverse of the MOSFET's $V_{ds}$. The useful lifetime is the time for which the MOSFET can be operated before wearout causes a significant drift in the operating parameters of the MOSFET. From FIG. 3, it can be seen that the lifetime of a MOSFET significantly decreases for larger values of $V_{ds}$. For example, an increase in $V_{ds}$ from 3.6 V to 4.3 V can reduce useful lifetime from 730 years to 8.7 years.

One of the limitations faced by MOSFET circuit designers is that wearout problems are exacerbated when the size of a circuit is decreased, since decreasing the circuit size effectively increases the electric fields experienced by the circuit. Accordingly, one approach used to combat wearout problems in MOSFETs is to reduce the power supply voltage. Although this approach might be satisfactory in some applications, it is limited since it causes reduced circuit performance, such as decreased operating speed.

Another approach seeks to reduce electric fields in MOSFETs by using lightly doped drain (LDD) structures. This is discussed in J. Sanchez et al., "Drain-Engineered Hot-Electron-Resistant Device Structures: A Review," IEEE Transactions on Electrical Devices, ED-36, June 1989. Although the use of LDD structures might be beneficial in some applications, circuit performance is typically reduced. Moreover, LDD structures require significantly more complicated manufacturing processes.

It would be beneficial, then, to have a new MOSFET with improved wearout reliability, that retains desirable features such as compatibility with standard supply voltages and small circuit dimensions. Moreover, it would be advantageous if such a MOSFET did not require a more complicated manufacturing process.

The manufacturing or "fabrication" process for producing MOSFETs such as the MOSFETs 100, 125 is already established in the art. FIGS. 3A–3F depict the steps involved in this process, as applied to the construction of the p-channel MOSFET 100 and the n-channel MOSFET 125. Referring to FIG. 3A, the n-well 101 is first created by using ion implantation to dope part of the substrate 102. Then, the oxide layer 118 is created; first, an oxide layer of even thickness (not shown) is grown, then selected areas 304, 306, 308 of the oxide layer are thickened; these thicker areas are called "field isolation regions." The field isolation regions 304, 306, 308 provide insulation between adjacent MOSFETs; for example, the region 306 insulates the MOSFETs 100, 125. The areas 300, 302 are not thickened since silicon nitride ($Si_3N_4$) is deposited over the areas 300, 302 prior to growing more oxide. Where the oxide is not covered by silicon nitride, the oxide thickens and "balloons" to form the field isolation regions 304, 306, 308. The silicon nitride is then chemically removed, as is the oxide in the regions 300, 302. Finally, a new thin oxide is grown in the regions 300, 302.

Next, the gates 104, 128 are constructed by (1) depositing and etching layers of polycrystalline silicon 114, 140; (2) depositing a metal layer (not shown); and (3) forming the metal-silicide layers 134, 142, 138, 108, 116, and 110 (FIG. 3B) by reacting the metal with silicon in a procedure such as annealing. Then, the p+ regions 106, 110 (FIG. 3C) and the n+ regions 132, 136 (FIG. 3D) are doped using p+ and n+ ion implantation, respectively. During implantation of the p+ regions 106, 110, an implant mask 310 having an aperture 312 is used as a template to selectively confine p+ ion implantation to the area 302 (FIG. 3E). Similarly, during implantation of the n+ regions 132, 136 an implant mask 314 having an aperture 316 is used to confine n+ ion implantation to the area 302 (FIG. 3F).

BRIEF SUMMARY OF INVENTION

The present invention is directed at the problems set forth above. In a general aspect, the invention comprises an otherwise conventional MOSFET whose $V_{ds}$ is reduced by means of Schottky diode clamping. More-particularly, a Schottky diode is integrated between the drain or source terminal and the bulk terminal of a MOSFET. One or more p-channel MOSFETs are formed in an n-well located in a silicon substrate, each MOSFET including a drain, gate, and source. In one implementation of a p-channel MOSFET, a Schottky diode is formed by a portion of a metal-silicide layer that overlaps a p+ region and contacts the n-well. In another implementation, where a drain is shared by multiple MOSFETs, the drain may include separate p+ regions underlying opposing edges of the associated metal-silicide-layer, permitting a central portion of the metal-silicide layer to contact the n-well.

In the exemplary p-channel MOSFET, each source is formed by a p+ region underlying a layer of metal-silicide. Each gate includes a layer of p+ or n+ doped polycrystalline silicon clad with a layer of metal-silicide; each gate is separated from the n-well by a layer of oxide. The circuit also includes a biasing region for supplying a bias voltage to the n-well, which may include an n+ region formed in the well underneath a layer of metal-silicide. In an illustrative application of the invention, one or more n-channel MOSFETs are also formed on the silicon substrate, in a manner similar to the structure of the p-channel MOSFETs. The drains of the n-channel MOSFETs are also structured to include Schottky diodes.

The invention offers substantially improved performance, which may be seen by considering an inverter constructed from one p-channel MOSFET and one n-channel MOSFET formed in accordance with the invention. In this arrangement, the Schottky diode of the p-channel MOSFET operates to prevent the n-channel MOSFET from experiencing excessive $V_{ds}$; analogously, the Schottky diode of the n-channel MOSFET operates to prevent the p-channel MOSFET from experiencing excessive $V_{ds}$.

DESCRIPTION OF DRAWINGS

The nature of the invention, as well as objects and advantages thereof, will become more apparent to those skilled in the art after consideration of the following detailed description in connection with the accompanying drawings, in which like reference numerals designate like parts throughout, wherein.

FIG. 8 is a diagram illustrating the increased performance of the MOSFETs of the present invention during switching;

DESCRIPTION OF A PREFERRED EMBODIMENT

Structure

Figure 4:
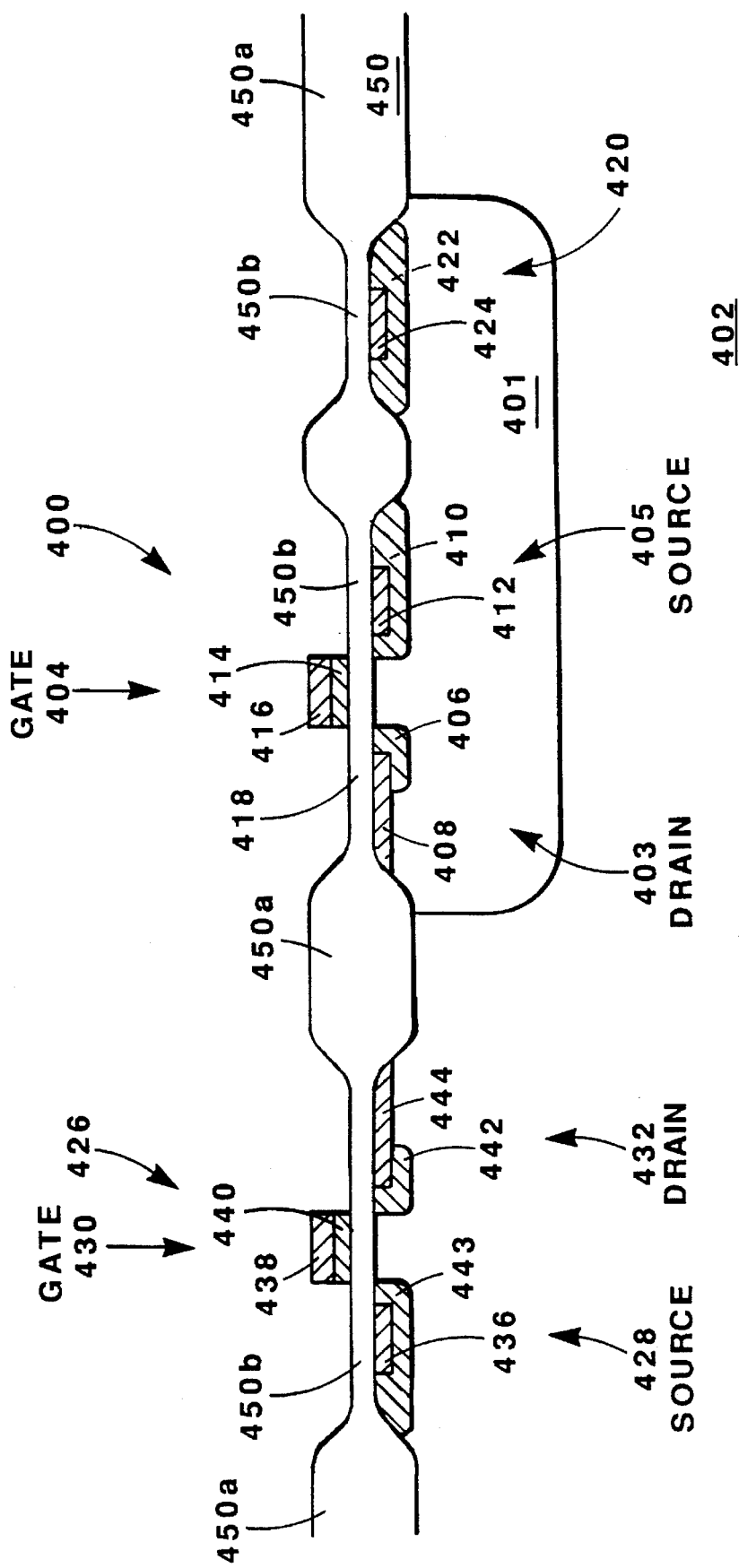
FIG. 4 is a cross-sectional view of a basic configuration of integrated MOSFETs 400, 426 utilizing metal-silicide cladding and selective doping to provide Schottky diodes in accordance with the present invention.

A cross-section of a silicon substrate 402 containing one p-channel MOSFET 400 and one n-channel MOSFET 426 is shown in FIG. 4, in accordance with one embodiment of the invention. The p-channel MOSFET 400 is located in an n-well 401 formed in the substrate 402. The MOSFET 400 is made up of a number of components, including a drain 403, gate 404, and source 405.

Although certain MOSFET structures are referred to as "drains" or "sources" in the present discussion, these designations are utilized for ease of explanation only. Since the drain and source of a typical MOSFET are interchangeable until the MOSFET is operated in a particular manner, either term is understood to be appropriate to describe one structure or the other.

The drain 403 is formed by a p+ region 406 that underlies a portion of a metal-silicide layer 408. A p-n junction diode is formed by the junction between the p+ region 406 and the n-well 401; furthermore, an ohmic contact is formed by the interface between the metal-silicide layer 408 and the p+ region 406. Additionally, a Schottky diode is formed by the interface between the metal-silicide layer 408 and the n-well 401. The leakage current of the Schottky diode is determined by the level of doping of the n-well 401. The resistance of the Schottky diode depends upon the area of contact between the metal-silicide layer 408 and the n-well 401. Moreover, the turn-on voltage of the Schottky diode is determined by the type of metal used in the metal-silicide layer 408. In the preferred embodiment, this metal comprises a refractory metal such as cobalt.

The gate 404 includes a layer of p+ or n+ doped polycrystalline silicon 414 clad with a layer of metal-silicide 416. The source 405 is formed by a p+ region 410 underlying a layer of metal-silicide 412. For the purpose of providing a bias voltage to the n-well 401, a biasing region 420 is included. The biasing region 420 includes an n+ region 422 underlying a layer of metal-silicide 424.

The n-channel MOSFET 426 is formed in the p-type silicon substrate 402. The components of the MOSFET 426 include a source 428, a gate 430, and a drain 432. The source 428 is formed by an n+ region 434 underlying a layer of metal-silicide 436. The gate 430 includes a layer of p+ or n+ doped polycrystalline silicon 438 clad with a layer of metal-silicide 440. The drain 432 is formed by an n+ region 442 underlying a portion of a metal-silicide layer 444. The drain 432, like the drain 403, includes an ohmic contact, a p-n junction diode, and a Schottky diode.

The gates 404 and 430 are separated from the n-well 401 and the p-type substrate 402 by a layer of oxide 450. The oxide layer 450 includes thickened field isolation regions 450a and thin regions 450b. The field isolation regions 450a insulate the MOSFET 400, the MOSFET 426, and the biasing region 420 from each other, as well as from other MOSFETs (not shown) located on the p-type substrate 402.

Figure 5:
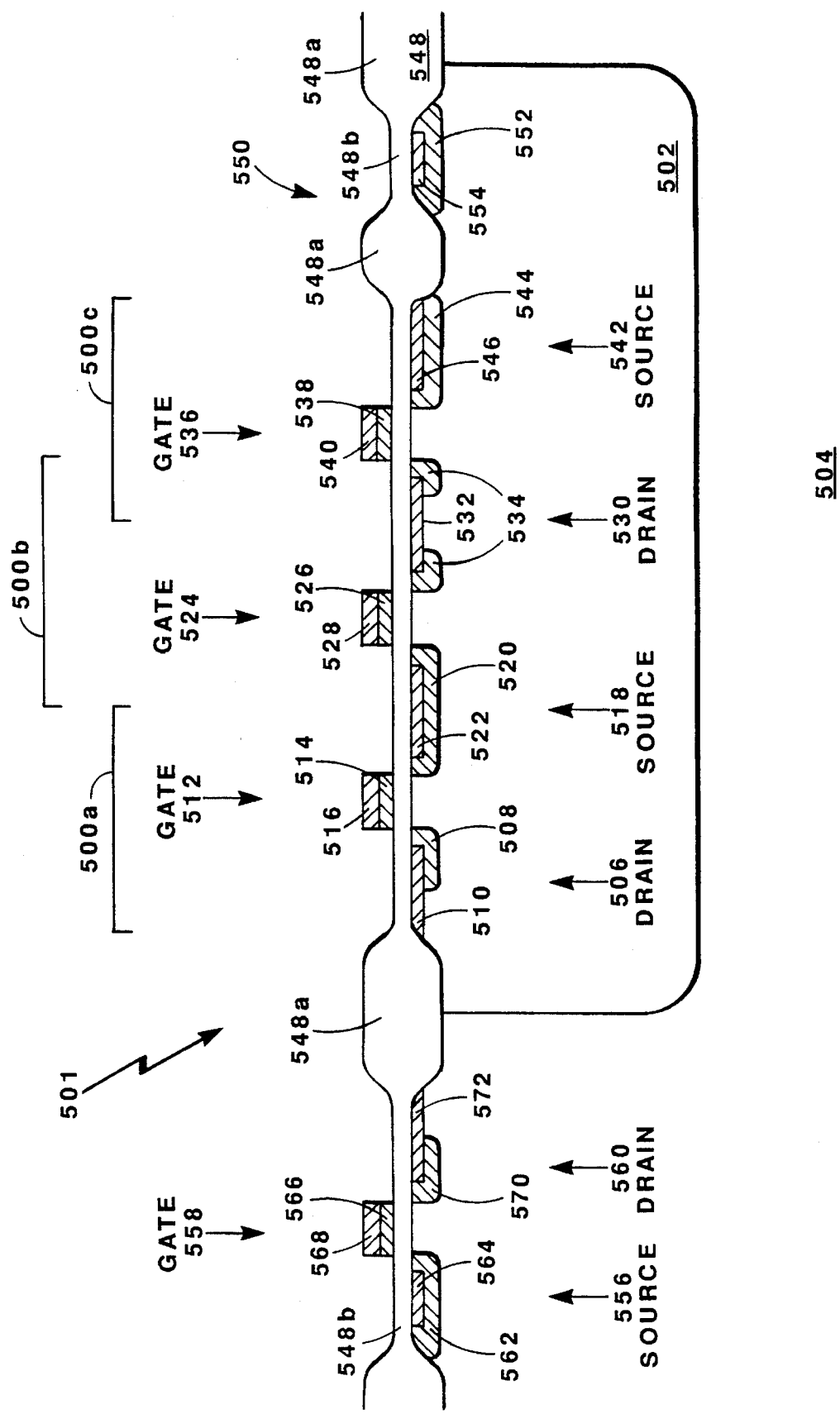
FIG. 5 is a cross-sectional diagram of a more complicated configuration of integrated MOSFETs 500a, 500b, 500c, 501 utilizing metal-silicide cladding and selective doping to provide Schottky diodes in accordance with the present invention.

In accordance with another, more complicated, embodiment of the invention, FIG. 5 illustrates a cross-section of a silicon substrate containing three p-channel MOSFETs 500a, 500b, 500c and one n-channel MOSFET 501. The p-channel MOSFETs 500a–c are formed in an n-well 502 located in a p-type silicon substrate 504. The MOSFETs 500a–c are made up of a number of components, including a drain 506, gate 512, source 518, gate 524, drain 530, gate 536, and source 542.

It is understood that certain drains and sources formed in the n-well 502 are shared by two adjacent MOSFETs. In particular, the source 518 is shared by the MOSFETs 500a and 500b; likewise, the drain 530 is shared by the MOSFETs 500b and 500c. Although a single n-channel MOSFET 501 is provided in the present example for simplicity, the invention contemplates multiple n-channel MOSFETs with one or more shared drains and/or sources.

The drain 506 is formed by a p+ region 508 that separates a portion of the metal-silicide layer 510 from the n-well 502. Similar to the drains 403, 432 of the MOSFETs 400, 426, an ohmic contact is formed by the interface between the metal-silicide layer 510 and the p+ region 508. Furthermore, a p-n junction diode is formed by the junction between the p+ region 508 and the n-well 502. Additionally, a Schottky diode is formed by the interface between the metal-silicide layer 510 and the n-well 502. Characteristics of the Schottky diode such as leakage current, resistance, and turn-on voltage, are determined in the same manner as described above with reference to the Schottky diode of the drain 403.

The gate 512 includes a layer of p+ or n+ doped polycrystalline silicon 514 clad with a layer of metal-silicide 516. The source 518 is formed by a p+ region 520 underlying a layer of metal-silicide 522. The gate 524, like the gate 512, includes a layer of p+ or n+ polycrystalline silicon 526 clad with a layer of metal-silicide 528.

The drain 530 includes a layer of metal-silicide 532 and a p+ region 534. As with the drain 506, the p+ region 534 separates a portion of the metal-silicide layer 532 from the n-well 502, thereby forming a Schottky diode. In contrast to the drain 506, however, the p+ region 534 only underlies opposing edges of the metal-silicide layer 532, and permits a central portion of the metal-silicide layer 532 to contact the n-well 502. The drain 530 is structured in this way since it is shared by the MOSFETs 500b and 500c, and each MOSFET 500b, 500c utilizes the part of the drain 530 nearest to that MOSFET 500b, 500c. The drain 530, then, is generally configured like two adjacent drains 506, one for each of the adjacent MOSFETs 500b, 500c. With drain 506, however, the p+ region 508 only separates one edge of the metal-silicide layer 510 from the n-well 502 since the drain 506 is utilized by only a single MOSFET, namely the MOSFET 500a. Accordingly, the drain 530 includes two ohmic contacts, two p-n junction diodes, and two Schottky diodes.

The gate 536, like the gates 512 and 524, includes a layer of p+ or n+ polycrystalline silicon 538 clad with a layer of metal-silicide 540. The source 542 includes a p+ region 544 that underlies a layer of metal-silicide 546.

The n-channel MOSFET 501 is formed in the silicon substrate 504. The components of the MOSFET 501 include a source 556, a gate 558, and a drain 560. The source 556 is formed by an n+ region 562 that underlies a metal-silicide layer 564. The gate 558 includes a layer of p+ or n+ doped polycrystalline silicon 566 clad with a layer of metal-silicide 568. The drain 560 is formed by an n+ region 570 underlying a portion of a metal-silicide layer 572. The drain 560, like the drain 506, includes an ohmic contact, a p-n junction diode, and a Schottky diode. The circuit also includes a biasing region 550 for providing a bias voltage to the n-well 502. The biasing region 550 includes an n+ region 552 underlying a layer of metal-silicide 554.

The gates 512, 524, 536, and 558 are separated from the n-well 502 and the p-type substrate 504 by a layer of oxide 548. The oxide layer 548 includes thickened field isolation regions 548a and thin regions 548b. The field isolation regions 548a insulate the MOSFETs 500a–c, the MOSFET 501, and the biasing region 550 from each other, as well as from other MOSFETs (not shown) located on the p-type substrate 504.

Operation

Figure 1:
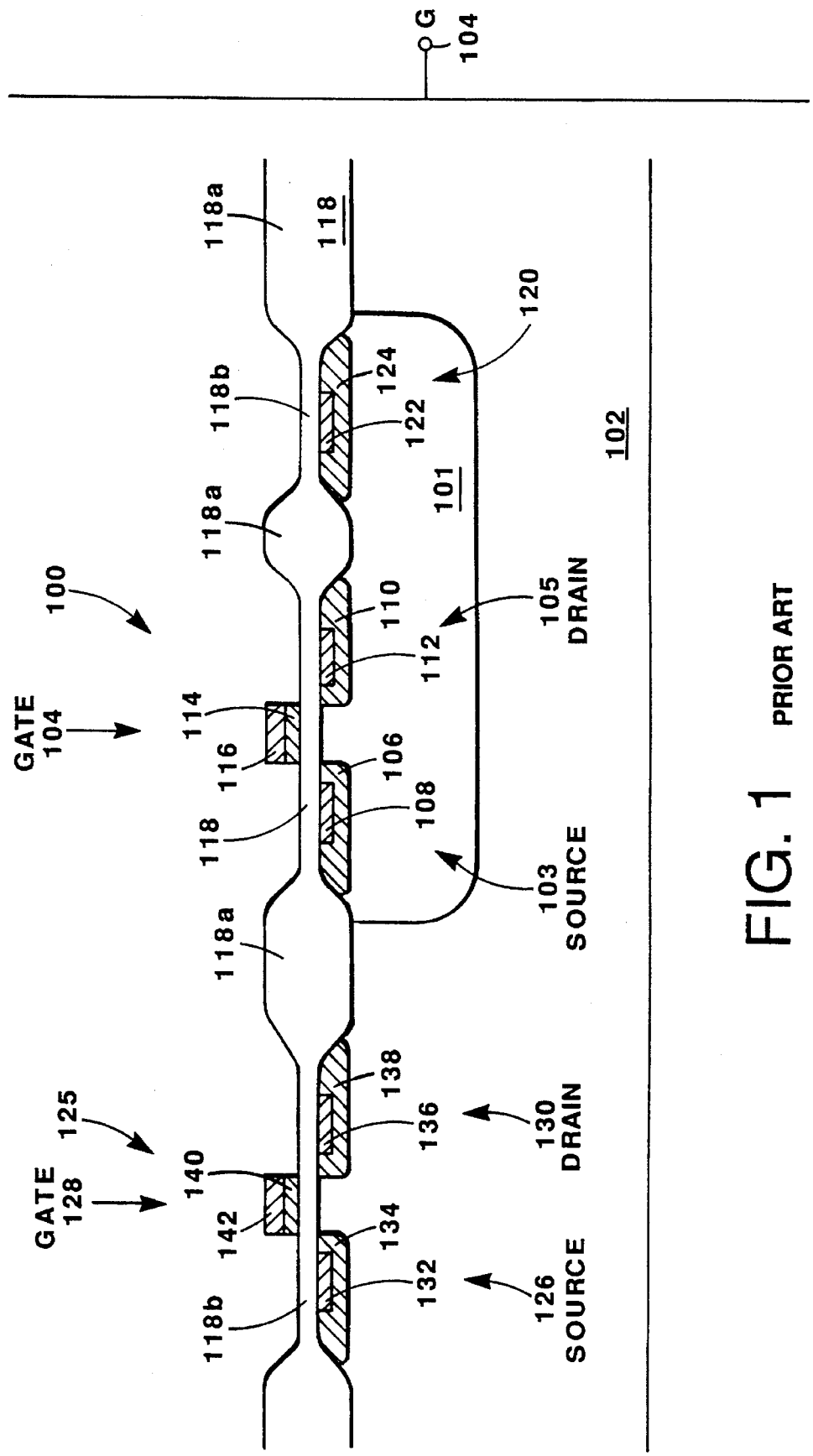
FIG. 1 is a cross-sectional diagram of integrated inverting MOSFETs 100, 125 as known in the prior art.
Figure 2B:
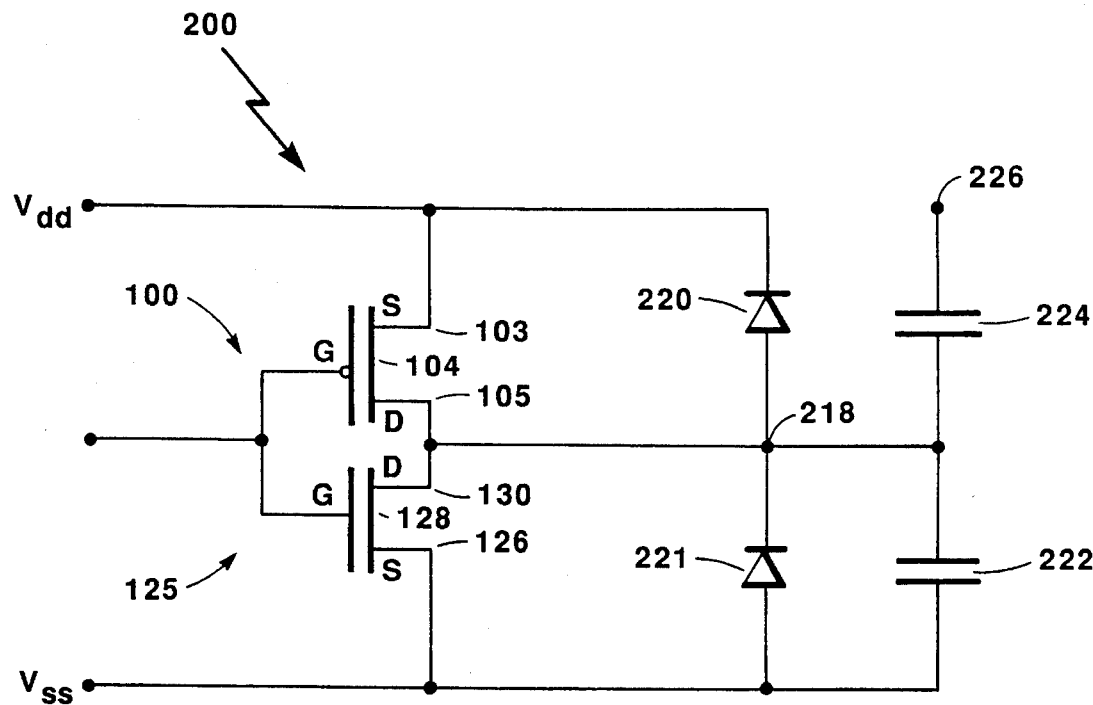
FIG. 2B is a schematic model 200 of an invertor constructed with the prior art MOSFETs 100, 125.
Figures 2A, 6A:
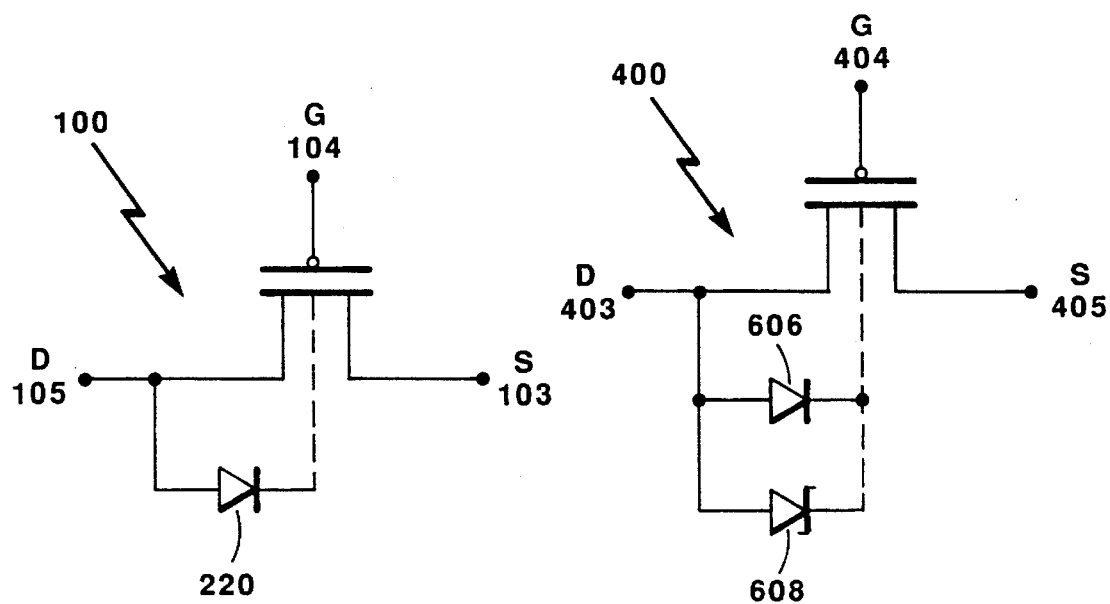
FIG. 2A is 1 schematic model of the prior art MOSFET 100.
FIG. 6A is a schematic model of the MOSFET 400 of the invention.
Figure 3:
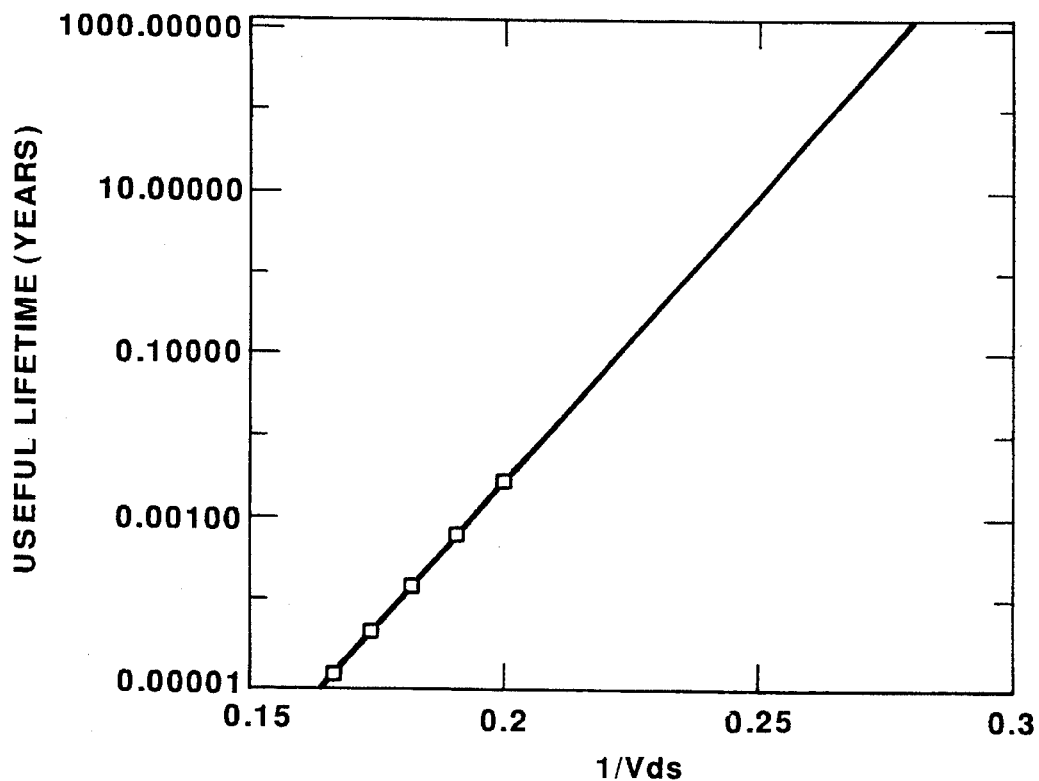
FIG. 3 is a diagram illustrating the effect of $V_{ds}$ on hot carrier wearout of a MOSFET circuit.

The structure of the MOSFET 400 is more easily understood by considering the schematic representation of FIG. 6A. The MOSFET 400 includes a diode 606 to represent the p-n junction diode formed by the p+ region 406 and the n-well 401. Furthermore, the MOSFET 400 includes a diode 608 to represent the Schottky diode formed by the metal-silicide layer 408 and the n-well 401. If the voltage at the drain 403 rises to a certain level, the diode 608 turns on, and current flows from the metal-silicide layer 408 to the n-well 401. In the schematic representation of FIG. 6A, current flows from the drain 403, through the diode 608, to the n-well 401. The turn-on voltage of the diode 608, which depends upon the type of metal used in the metal-silicide layer 408, is lower than the p-n junction diode 606. In the present example, where the metal-silicide layers comprise cobalt, the turn-on voltage of the diode 608 is about 0.3 V. The maximum voltage at the drain 403 is therefore $V_{dd}$ plus 0.3 V. When the source 405 and the n-well 401 are both connected to $V_{dd}$, the diode 608 will effectively limit $V_{ds}$ to 0.3 V above $V_{dd}$.

Figure 6B:
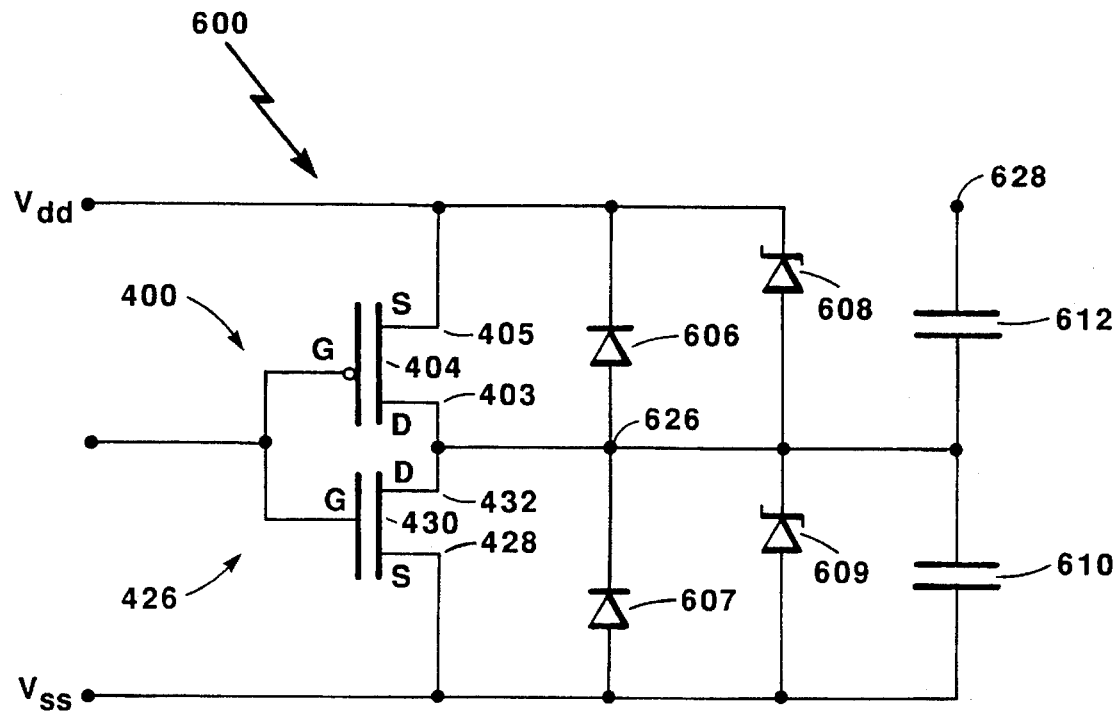
FIG. 6B is a schematic model 600 of an inverter constructed with the MOSFETs 400, 426 of the present invention.

The operation of MOSFETs constructed in accordance with the present invention may be explained by considering a representative application of the MOSFETs 400, 426. This representative application comprises an inverter (not shown) made with a p-channel MOSFET and an n-channel MOSFET. In the present example, the MOSFET 400 provides the p-channel MOSFET of the inverter, and the MOSFET 426 provides the n-channel MOSFET of the inverter. The inverter is schematically represented by an inverter-model 600, shown in FIG. 6B. The inverter-model 600 is constructed by connecting the gate 404 of the MOSFET 400 to the gate 430 of the MOSFET 426. Also, the drain 403 of the MOSFET 400 is connected to the drain 432 of the MOSFET 426. The source 405 of the MOSFET 400 is connected to $V_{dd}$, which provides power such as 3.3 V. The n-well 401 is also connected to $V_{dd}$ (connection not shown). The source 428 of the MOSFET 426 is connected to $V_{ss}$, which is grounded; moreover, the substrate 402 is also connected to $V_{ss}$ (connection not shown). The input to the inverter-model 600 is electrically connected to the gates 404, 430, and the output of the inverter-model 600 appears on a node 626.

The inverter-model 600 also includes various circuit components 606, 607, 608, 609, 610, and 612 to simulate various electrical characteristics of the MOSFETs 400, 426. Specifically, the inverter-model 600 includes diodes 606, 607, 608, and 609. As explained above with reference to FIG. 2A, the diode 606 represents the p-n-junction diode formed by the p+ region 406 and the n-well 401, and the diode 608 represents the Schottky diode formed by the metal-silicide layer 408 and the n-well 401. Similarly, the diode 607 represents the p-n junction diode formed by the p-type substrate 402 and the n+ region 442, and the diode 609 represents the Schottky diode formed by the metal-silicide layer 444 and the p-type substrate 402.

The inverter-model 600 also includes a load capacitor 610, to simulate the capacitance of a load connected to the MOSFETs 400, 426, and to simulate the self-loading of these MOSFETs. Also included is a coupling capacitor 612, representing the coupling capacitance between the node 626 and an adjacent node 628 on the p-type substrate 402. The adjacent node 628 is provided to simulate the signal produced by another electrical component contained on the p-type substrate 402, such as a nearby current-carrying wire. One of the main reasons to include the node 628 and capacitor 612 is to study the reaction of the inverter-model 600 when the node 628 experiences a transition from a low voltage to a high voltage.

When a voltage transition occurs at the node 628, the capacitor 612 transfers charge to the node 626; the voltage change at the node 626 depends upon the ratio of the capacitor 612 to the total capacitance of the capacitors 610, 612. The voltage at the node 626 is regulated, however, by the clamping action of the diodes 608, 609.

More specifically, the diode 609 prevents the voltage at the node 626 from dropping more than 0.3 V below $V_{ss}$. When the voltage at the node 626 falls 0.3 V below $V_{ss}$, the Schottky diode 609 (formed by the p-type substrate 402 and the metal-silicide layer 444) turns on and permits current to flow from the p-type substrate 402 to the metal-silicide layer 444. Accordingly, the voltage at the node 626 is "clamped" to within 0.3 V of $V_{ss}$. This limits the maximum value of $V_{ds}$ that can be applied to the MOSFET 400, thus reducing the wearout of the MOSFET 400.

Likewise, the diode 608 prevents the voltage at the node 626 from rising more than 0.3 V above $V_{dd}$. When the voltage at the node 626 rises more than 0.3 V above $V_{dd}$, the Schottky diode 608 (formed by the n-well 401 and the metal-silicide layer 408) turns on and permits current to flow from the metal-silicide layer 408 to the n-well 401, thereby helping to dissipate the excess voltage at the node 626. Accordingly, the voltage at the node 626 is "clamped" to within. 0.3 V above $V_{dd}$, thus reducing the wearout of the MOSFET 426.

Test Results

Figure 7:
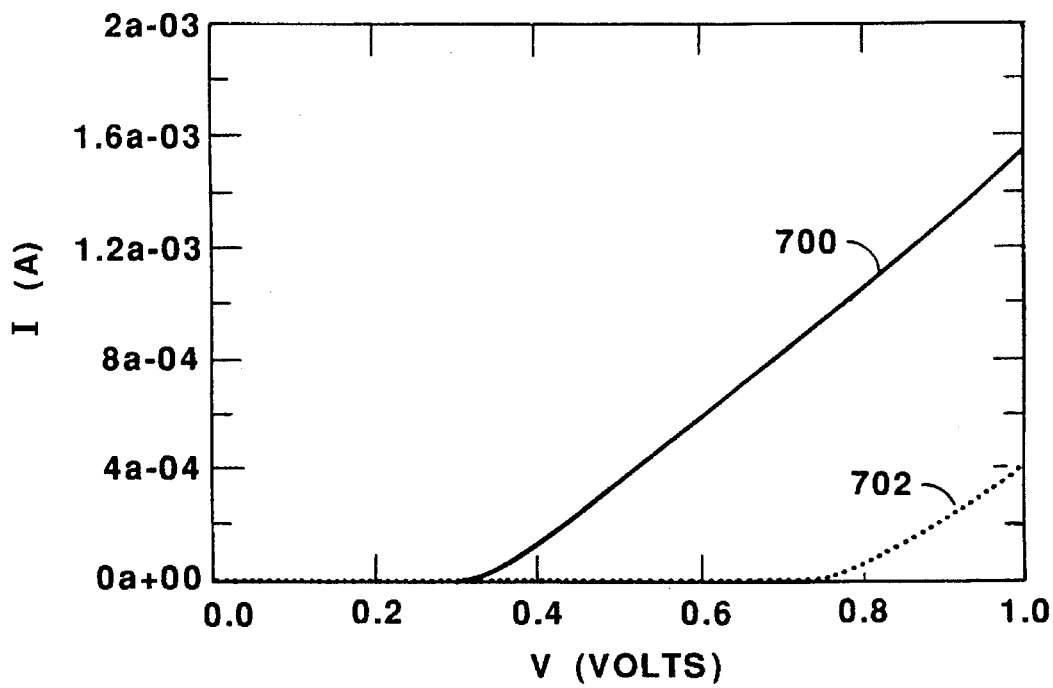
FIG. 7 is a diagram illustrating the reduced turn-on voltage of the Schottky diode 608 of the present invention.

Various laboratory experiments were conducted to better understand the operation of the MOSFETs of the invention. In FIG. 7, current versus voltage curves 700, 702 are shown for a Schottky diode and a p-n junction diode, respectively. FIG. 7 verifies that discrete Schottky diodes similar to the integrated Schottky diodes 608, 609 of the invention have a turn-on voltage of about 0.3 V, which is significantly lower than the 0.7 V turn-on voltage of the p-n junction diodes 220, 221.

Another test was conducted first using a computer simulated model of the inverter-model 200, and then using a computer simulated model of the inverter-model 600. This test was performed to investigate the $V_{ds}$ of the MOSFETs in response to a "capacitive coupling event" in which the adjacent node 226 or 628 experiences a transition form a low voltage to a high voltage. If $V_{dd}$ is 3.6 V, the voltage at the output node 218 or 626 tends to rise to 4.32 V as explained above. However, the voltage at the output node 218 will be clamped to 4.3 V (i.e. within 0.7 V of $V_{dd}$) by the p-n junction diode 220 of the prior art MOSFET 100. In contrast, with the Schottky diode 608 of the present invention the voltage at the node 626 will be clamped to 3.9 V (i.e. within 0.3 V of $V_{dd}$).

One of the most damaging situations that causes n-channel MOSFET hot carrier wearout occurs when the MOSFET's $V_{ds}$ is high and the MOSFET's $V_{gs}$ is between the turn-on voltage of the MOSFET and $V_{dd}$. This situation occurs for the inverter when it is turned on shortly after a capacitive coupling event. This situation is potentially damaging since the output voltage of the inverter is abnormally high due to the capacitive coupling event, while the input is simultaneously being driven from 0 V to $V_{dd}$ as the inverter is being turned on. As a result, while $V_{ds}$ is abnormally high, the MOSFET's $Vg_s$ passes through the bias region that is most damaging from the standpoint of hot carrier wearout.

Figure 8:
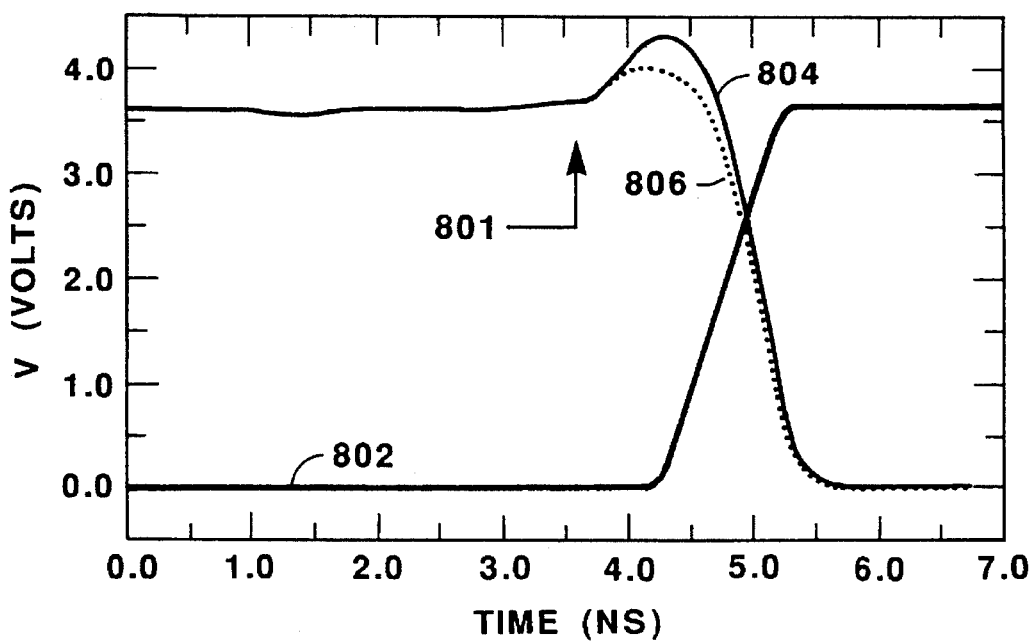

In FIG. 8, the output voltages of the inverter-model 200 and the inverter-model 600 are shown as curves 804, 806 respectively. The capacitive coupling event occurs at a time indicated by.801. In the case of the prior art inverter-model 200, the voltage at the output node 218 is clamped by the p-n junction diode 220 to 4.3 V, i.e. 0.7 V above the expected output voltage of 3.6 V. After voltage is applied to the $V_{gs}$ of the n-channel MOSFET 125 to turn the inverter on, the voltage at the output node 218 is 4.3 v as the $V_{gs}$ starts to increase. With the Schottky diode 608 of the invention, the voltage at the output node 626 is limited to 3.9 V, i.e. 0.3 V above the expected output voltage of 3.6 V. In this case, after voltage is applied to the $V_{gs}$ of the n-channel MOSFET 426 to turn the inverter on, the voltage at the output node 626 is only 3.9 V as $V_{gs}$ starts to increase.

Therefore, it is desirable to limit the output signal of the inverter at all times, to prevent excessive output voltages. The Schottky diode 608 of the invention minimizes excessive output voltages since it limits voltage increases at the output node 626 to 0.3 V, as shown by curve 806 in FIG. 8. When the Schottky diode 608 of the invention is used, the excessive voltage at the node 626 immediately after a $V_{gs}$ transition will therefore be no larger than 3.9 V.

Computerized simulations were also performed to predict the useful lifetime of the MOSFET 400 of the inverter-model 600 before significant wearout occurred. These simulations were carried out for the voltage waveforms in FIG. 8. These simulations predicted a useful lifetime of 7.4 years for p-n junction diode clamping and a useful lifetime of 187 years for Schottky diode clamping.

Fabrication

Figure 3A:
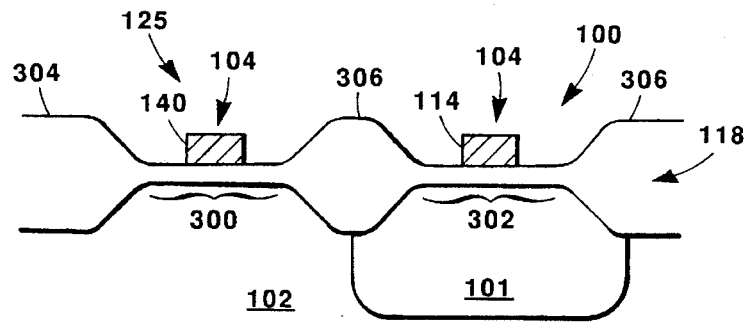
FIG.8 3A–3D are cross-sectional views of the MOSFETs 100, 125, illustrating some of the steps performed in the construction of the MOSFETs 100, 125.
Figure 3B:
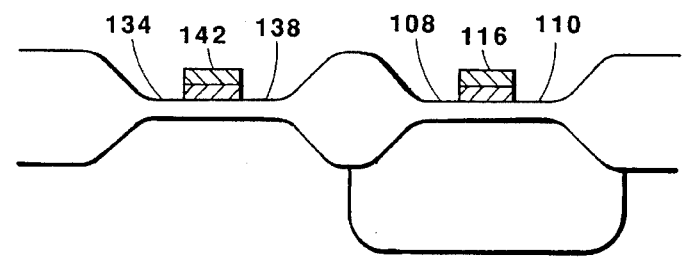
Figure 3C:
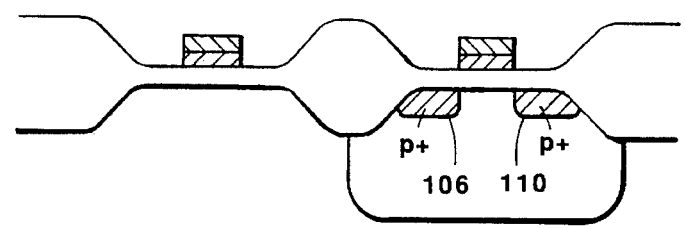
Figure 3D:
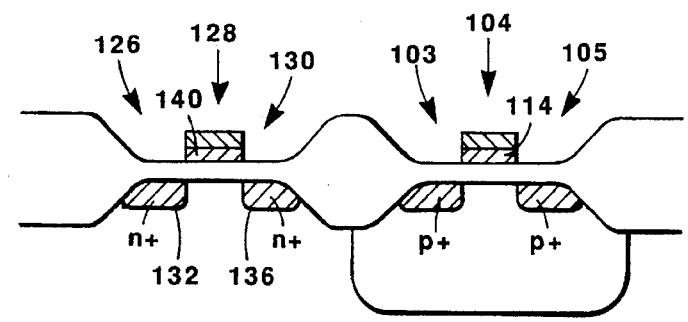
Figure 3E:
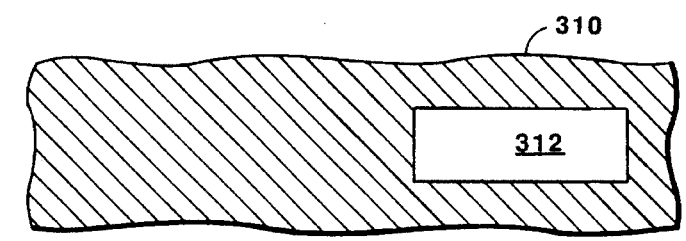
FIGS. 3E–3F are top plan views of implant masks 310, 314 used in the construction of the MOSFETs 100, 125.
Figure 3F:
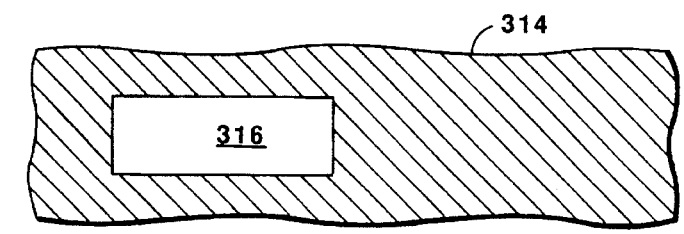
Figure 9A:
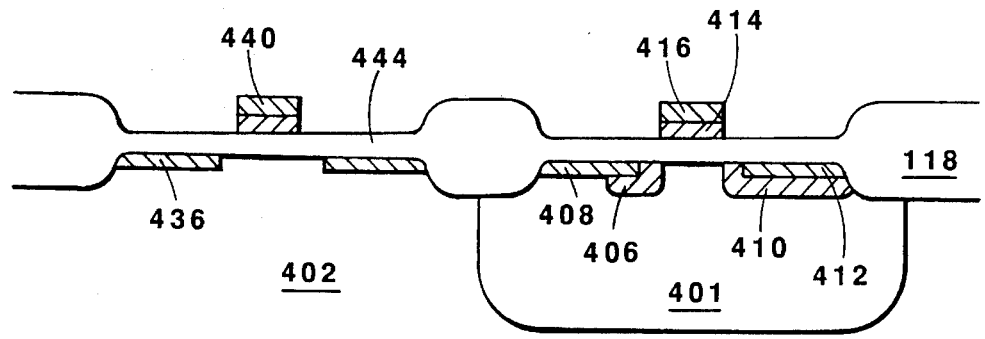
FIGS. 9A–9B are cross-sectional views of the MOSFETs 400, 426, illustrating some of the steps performed in the construction of the MOSFETs 400, 426.
Figure 9B:
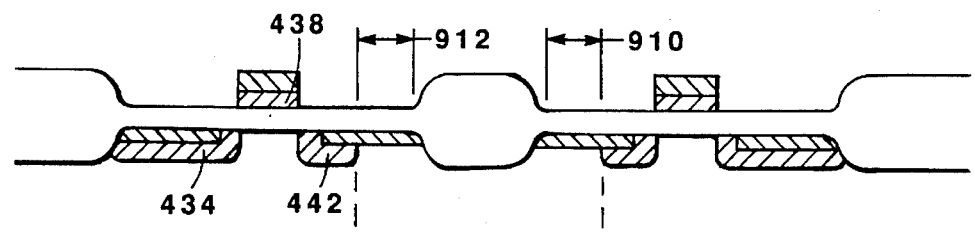
Figure 9C:
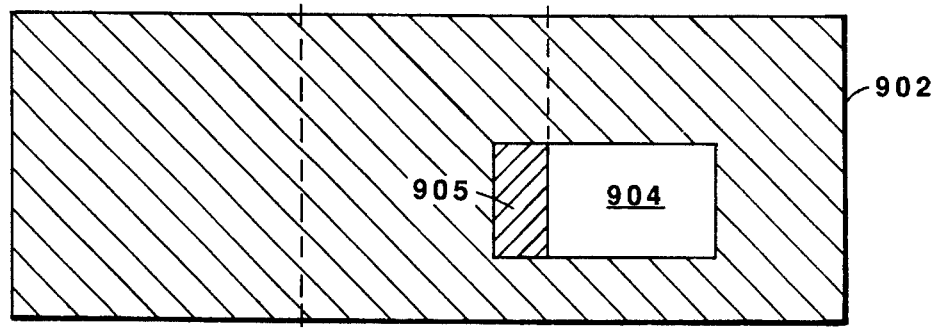
FIGS. 9C–9D are top plan views of implant masks 902, 906 used in the construction of the MOSFETs 400, 426.
Figure 9D:
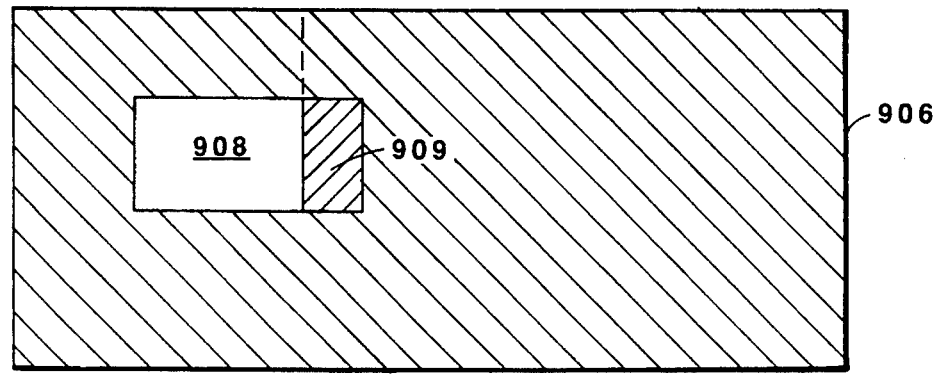

To fabricate MOSFETs in accordance with the invention, the process discussed above and illustrated in FIGS. 3A–3C is first performed to create the oxide layer 118, n-well 401, gate 104, and metal-silicide layers 412, 416, 408, 444, 440, and 436. However, the p+ regions 406, 410 (FIG. 9A) are created using a modified implant mask 902 (FIG. 9C). Unlike the mask 310, the mask 902 is modified since it covers a portion 910 (FIG. 9B) of the metal-silicide layer 412; this occurs because the aperture 904 is smaller than the aperture 312. Specifically, the mask 902 covers an area 905, which is not covered by the mask 310. Likewise the n+ regions 434, 442 (FIG. 9B) are created using a modified implant mask 906 (FIG. 9D). Unlike the mask 314, the mask 906 is modified since it covers a portion 912 of the metal-silicide layer 444; this occurs because the aperture 908 is smaller than the aperture 316. Specifically, the mask 906 covers an area 909, which is not covered by the mask 314.

The size of the p+ region 406 determines how much metal-silicide 408 contacts the n-well 401. Likewise, the size of the n+ region 442 determines how much metal-silicide 444 contacts the p-type substrate 402. The sizes of the p+ region 406 and the n+ region 442 are thus important, since these features effectively determine the amount of current that the Schottky diodes 608, 609 will supply for a given voltage applied to the diodes. The leakage currents of the Schottky diodes 608, 609 are determined by the level of doping of the n-well 401 and the p-type substrate 402, respectively. The turn-on voltages of the Schottky diodes 608, 609 depend on the type of metal used in the metal-silicide layers 444, 412. In the present example, the metal comprises cobalt and the Schottky diodes 608, 609 turn on at about 0.3 V.

Conclusion

The present invention provides a number of advantages, then, to overcome a number of previously unsolved problems. For example, the invention provides an integrated Schottky diode that significantly improves clamping of a MOSFET's $V_{ds}$. Moreover, the present invention does not require additional manufacturing process steps beyond those already required to produce MOSFETs with metal-silicide cladding. Specifically, the method of the invention is implemented by re-designing one or more ion implantation masks, to restrict doping in a portion of a MOSFET's drain. Another benefit is that the present invention does not involve any reduction in performance, or any increase in circuit size, in contrast to prior arrangements. For example, MOSFET performance would suffer by about 5% to 10% if LDD technology were used to achieve the MOSFET useful lifetime provided by the present invention. In addition, the invention reduces- wearout problems associated with voltage overshoots, since a Schottky diode is advantageously utilized to reduce $V_{ds}$. Moreover, this is done without lowering $V_{dd}$ and suffering the inherent loss of speed associated with a lower $V_{dd}$.

While there have been shown what are presently considered to be preferred embodiments of the invention, it will be apparent to those skilled in the art that various changes and modifications can be made herein without departing from the scope of the invention as defined by the appended claims. For example, it is understood that the p+ and n+doped regions may be generally reversed, depending upon whether the MOSFETs are formed on a p-type substrate, n-type substrate, n-well or p-well. Moreover, the present disclosure is presented in the context of MOSFETs only for ease of understanding, since the majority of FETs in production and use today are MOSFETs. However, the present invention is understood to be equally applicable to other transistors, such as MES (metal semiconductor) FETs.

What is claimed is:

1. A field effect transistor, said transistor operable to establish a drain-bulk terminal voltage, comprising:
   a silicon bulk terminal including a drain, a gate, and a source proximate to a surface of the bulk terminal, said bulk terminal operable to establish a drain-source voltage and,
   a Schottky diode, having a planar junction region integrated between the drain and the bulk terminal, for limiting the drain-bulk terminal voltage.

2. A field effect transistor, said transistor operable to establish a drain-bulk terminal voltage, comprising:
   a silicon bulk terminal including doped regions proximate to a surface of the bulk terminal forming a source, a gate, and a drain, said bulk terminal operable to establish a drain-source voltage;
   a layer of oxide separating the gate from the bulk terminal; and
   a Schottky diode, having a planar junction region integrated between the drain and the bulk terminal, for limiting the drain-bulk terminal voltage.

3. A field effect transistor, said transistor operable to establish a drain-bulk terminal voltage, having a drain, a source and a gate, comprising:
   a first region operable as one of said drain and source, formed in a bulk terminal of a first conductivity type;
   a second region operable as a gate, disposed over the bulk terminal, said bulk terminal operable to establish a drain-source voltage;
   a third region operable as the other of said drain and source, formed in the bulk terminal; and
   a Schottky diode, having a planar junction region integrated between the third region and the bulk terminal, for limiting the drain-bulk terminal voltage.

4. The transistor of claim 3, wherein the third region comprises:
   a layer of conductive material formed in the bulk terminal adjacent to a surface of the bulk terminal; and
   a layer of second conductivity type silicon formed in the bulk terminal, wherein the second conductivity type silicon layer is disposed between a first portion of the conductive material and the bulk terminal, and wherein a second portion of the conductive material directly contacts the said surface of said bulk terminal, the first conductivity type silicon and the second conductivity type silicon being of predominantly opposite carriers.

5. The transistor of claim 4, wherein said layer of conductive material comprises metal-silicide.

6. A field effect transistor, comprising:
   a silicon bulk terminal of a first conductivity type silicon, the bulk terminal having a first surface;
   a diffused source in the bulk terminal including,
      a first metal-silicide layer adjacent to the first surface and
      a first region of a second conductivity type silicon, with the first region spacing the metal-silicide layer from the bulk terminal,
      and the first conductivity type silicon and the second conductivity type silicon have predominantly opposite carriers;
   a diffused drain in the bulk terminal including,
      a second metal-silicide layer adjacent to the first surface, and
      a second region of the second conductivity type silicon, separating a first portion of the second metal-silicide layer from the bulk terminal, wherein a second portion of the second metal-silicide layer contacts the bulk terminal at said first surface; and
   a gate disposed over the bulk terminal including a third region of the first or second conductivity type silicon.

7. The transistor of claim 6, further including an oxide layer interposed between the surface and the gate.

8. The transistor of claim 6, wherein the gate comprises polycrystalline silicon.

9. The transistor of claim 6, further including a layer of metal-silicide disposed on the gate.

10. The transistor of claim 6, wherein each of the metal-silicide layers comprises cobalt-silicide.

11. The transistor of claim 6, wherein the first conductivity type silicon comprises n doped silicon and the second conductivity type silicon comprises p doped silicon.

12. The transistor of claim 6, wherein the first conductivity type silicon comprises p doped silicon, and the second conductivity type silicon comprises n doped silicon.

13. The transistor of claim 6, wherein first and second regions comprise n+ doped silicon.

14. The transistor of claim 6, wherein the first and second regions comprise p+ doped silicon.

15. A field effect transistor, said transistor operable to establish a drain-well voltage, comprising a silicon bulk terminal containing a well, wherein the well includes a drain, a gate, and a source proximate to a surface of the well, and a Schottky diode, having a planar junction region proximate to said well surface integrated between the drain and the well, for limiting the drain-well voltage.

16. A field effect transistor, said transistor operable to establish a drain-well voltage, comprising:
a silicon bulk terminal including a well that contains doped regions proximate to a surface of the well, said well operable to establish a drain-source voltage and forming a source, a gate, and a drain;
a layer of oxide separating the gate from the well, whereby said field effect transistor comprises a MOSFET; and
a Schottky diode, having a planar junction region integrated between the drain and well, for limiting the drain-well voltage.

17. A field effect transistor, said transistor operable to establish a drain-well voltage comprising:
a bulk terminal of a first conductivity type containing a well of a second, opposite conductivity type, said well operable to establish a drain-source voltage;
a first region of the first conductivity type formed in the well, wherein the first region is operable as one of a drain or source;
a second region of one of said first and second conductivity types disposed above the well, wherein the second region is operable as a gate; and
a third region of the first conductivity type formed in the well, where the third region is operable as the other of said drain and source and includes
a Schottky diode, having a planar junction region integrated between the third region and the well, for limiting the drain-well voltage.

18. The transistor of claim 17, wherein the third region comprises:
a layer of conductive material formed in the well adjacent to a surface of the well; and
a layer of first conductivity type silicon formed in the well, wherein the silicon layer separates a portion of the conductive material from the well.

19. The transistor of claim 18, wherein the layer of conductive material comprises metal-silicide.

20. A field effect transistor, comprising:
a silicon bulk terminal of a first conductivity type silicon, including a well of a second conductivity type silicon, the well having a first surface;
a source in the well including a first metal-silicide layer adjacent to the first surface and a first region of the first conductivity type silicon, wherein the first region separates the metal-silicide layer from the well, and wherein the first conductivity type silicon and the second conductivity type silicon have predominantly opposite carriers;
a drain in the well including a second metal-silicide layer adjacent to the surface and a second region of the first conductivity type silicon separating a first portion of the second metal-silicide layer from the well, wherein a second portion of the second metal-silicide layer contacts the well; and
a gate including a third region of the first or second conductivity type silicon.

21. The transistor of claim 20, further including an oxide layer interposed between the surface and the gate.

22. The transistor of claim 20, further including a layer of metal-silicide disposed on the gate.

23. The transistor of claim 20, wherein the gate comprises polycrystalline silicon.

24. The transistor of claim 20, wherein each of the metal-silicide layers comprises cobalt-silicide.

25. The transistor of claim 20, wherein the first conductivity type silicon comprises n doped silicon and the second conductivity type silicon comprises p doped silicon.

26. The transistor of claim 20, wherein the first conductivity silicon comprises p doped silicon and the second conductivity silicon comprises n doped silicon.

27. The transistor of claim 20, wherein the first and second regions comprise n+ doped silicon.

28. The transistor of claim 20, wherein the first and second regions comprise p+ doped silicon.

* * * * *